United States Patent [19]

Manring

[11] Patent Number: 4,774,157
[45] Date of Patent: Sep. 27, 1988

[54] PATTERNED METAL INTERLAYER IN A MATRIX

[75] Inventor: Lewis E. Manring, Wilmington, Del.

[73] Assignee: E. I. Du Pont De Nemours and Company, Wilmington, Del.

[21] Appl. No.: 51,859

[22] Filed: May 19, 1987

[51] Int. Cl.$^4$ .......................... G03F 7/00; G03C 5/16; C25D 7/00; C25C 1/00

[52] U.S. Cl. ...................................... 430/14; 430/324; 430/325; 430/326; 430/945; 427/123; 427/125; 204/22; 204/130; 204/140; 204/131; 428/199; 428/201; 428/458

[58] Field of Search ............... 430/324, 325, 326, 945, 430/14; 427/123, 125; 204/22, 130, 140, 131, 142; 428/199, 201, 458

[56] References Cited

U.S. PATENT DOCUMENTS

| | | | |
|---|---|---|---|
| 3,718,473 | 2/1973 | Gervay et al. | 96/83 |
| 3,879,204 | 4/1975 | Gervay | 96/83 |
| 4,001,093 | 1/1977 | Koontz et al. | 204/15 |
| 4,361,641 | 11/1982 | Angus et al. | 430/313 |
| 4,512,855 | 4/1975 | Mazur | 204/22 |
| 4,657,833 | 4/1987 | Hadley, Jr. et al. | 430/52 |
| 4,668,354 | 5/1987 | Levy | 204/130 |
| 4,692,360 | 9/1987 | Manring et al. | 427/125 X |

OTHER PUBLICATIONS

"Photographic Silver Halide Diffusion Process", The Focal Press, London and New York, 1972, pp. 13-31, Roff et al.
Polymer News, 11, 164 (1986), Daly et al.
Journal of Electrochemical Society, 133, 1152 (1986), Angus et al.
Abstracts 30th IUPAC International Symposium on Macromolecules, 224 (1985), Minnema et al.
Journal of Applied Polymer Science, 30, 2589, Peppas et al.

*Primary Examiner*—John L. Goodrow
*Assistant Examiner*—Cynthia Hamilton

[57] ABSTRACT

This invention resides in a counter-current diffusion method for the formation of a metallic interlayer within a matrix, for example, a polymeric matrix, by controlling the permeability of the matrix, the permeability preferably being controlled by controlling matrix swelling.

19 Claims, 3 Drawing Sheets

PATTERNED METAL INTERLAYER IN A MATRIX

BACKGROUND OF THE INVENTION

1. Field of the Invention

This invention relates to the deposition of a metal as a patterned interlayer in a matrix.

2. Background

There exist in the art many different chemical or physical methods by which a zero-valent metal can be introduced into or placed on a polymeric film. Among these, some are capable of producing a thin continuous coating at a surface of the polymer, for example, metal vapor deposition or electroless plating. Other processes, such as silver halide photography, discussed further below, and certain forms of chemical deposition, produce metal particles embedded within the polymeric film. These particles are generally dispersed to such a degree that they lack the characteristic electrical or optical properties of a continuous metal layer.

Existing art includes two ways in which metals can be introduced into preexisting solid polymeric films. The most common example involves photographic technology (see, for example, A. Roff and E. Weyde, "Photographic Silver Halide Diffusion Process", The Focal Press, London and New York, 1972, pp 13-31). Conventional photographic methods produce metal particles dispersed within a polymeric film, wherein their primary purpose is to absorb light. These particles are generally dispersed to such a degree that they do not constitute a continuous phase and, therefore, lack the macroscopic properties of electrical conductivity and optical reflectivity commonly associated with surface-metallized structures.

The second method of introducing a metal into a preexisting solid polymeric film is that of U.S. Pat. No. 4,512,855 which discloses a metal interlayer deposition (MID) process. This process involves reduction of metal ions, diffusing from one surface of a polymeric film, by electrons supplied via redox reactions of the polymer, the electrons being supplied from the opposite surface of the film. Among the unique and desirable features of the MID process is the fact that it is capable of producing metal interlayers of sufficient density that they are electrically conductive, and with sufficiently smooth and sharply defined surfaces that they are optically reflective.

Additional techniques for introducing metallic interlayers into preexisting films are disclosed in U.S. Pat. No. 4,657,833 and in commonly assigned pending U.S. patent applications Ser. Nos. 820,234 filed Jan. 21, 1986 and allowed Apr. 23, 1987; and 901,770 filed Aug. 29, 1986 and allowed Dec. 18, 1986. The disclosures of U.S. Pat. Nos. 4,512,855 and 4,657,833 and the aforesaid patent applications are hereby incorporated by reference. The techniques disclosed therein are of use in carrying out the invention which will be described in detail hereinafter.

The techniques of the previous two paragraphs are dependent on the diffusion of metal ions ($M^{n+}$) through the film from one surface thereof. Some of the techniques are dependent on the diffusion of a solution of a reducing agent through the film from an opposite surface of the film. The techniques of U.S. Pat. Nos. 4,512,855 and 4,657,833 are notably different from the other techniques in that, although metal ions ($M^{n+}$) diffuse from one surface of the film, the reduction of the metal ions to zero-valent metal is effected by means of electrons which do not diffuse in solution through the film, but rather are transported through the film itself. The films of these patents comprise a reversibly redox active polymer, that is, a polymer which is capable of accepting and donating electrons rapidly and without competing, irreversible chemical changes. Although diffusion of a solution of a reducing agent through a polymer is different mechanistically from the transporting of electrons through a reversibly redox active polymer, and although reduction of metal ions by a reducing agent in solution and reduction of metal ions by electrons in a polymeric matrix are different in kind, the invention which is described in detail hereinafter is applicable to both systems, that is, wherein metal ions are reduced either by a reducing agent in solution or by electrons in a polymeric matrix. For this reason, the term "counter-current diffusion" is used herein in the generic sense and includes both electro-chemical metal interlayer and chemical metal interlayer formation techniques. Moreover, the term "reductant" (R), as used herein, embraces both electrons which are transported in a reversibly redox active polymer, and chemical reducing agents which are transported in a solution. The metallic interlayers formed by the above techniques can be conductive, thereby being useful in the formation of conductive sheets. Furthermore, patterned metallic interlayers can be useful as flexible circuits and in other circuitry applications, including partially transparent electronic shielding. These patterned metallic interlayers can be formed via the techniques cited in the previous paragraph by controlling the access of either $M^{n+}$ or R to certain regions along the surface of the film. There are three general methods of controlling the access of $M^{n+}$ or R at the film surface;

1. A reactant barrier mask placed at the surface of the film limits the areas where reactants can diffuse into the film.
2. A patterned cathode defines the area where electrons are available at the surface of the film.
3. The electrons from a cathode are allowed access to the film in a two-dimensionally controlled fashion by a photosensitive layer.

The first method can be used with all of the counter-current diffusion methods described above. The reactant barrier mask can be any material which is impermeable to one of the reactants. The second method is only applicable to counter-current diffusion methods wherein at least one of the reactants is supplied by an electrode at the surface of the film. All of the patterning methods which limit reactant access at the film surface suffer inherent resolution losses due to lateral diffusion of the reactants in the matrix after passing the surface barrier.

Many methods have been developed to create conductive images on a variety of substrates. Most of the imaging methods rely on the application of a mask to the substrate, which mask physically protects the desired areas during the metallization process. For low resolution applications the mask can be pressed against the substrate during metallization, as is done in screen process printing. For higher resolution applications a resist material which is sensitive to electromagnetic radiation is applied to the substrate, and the desired pattern is imaged through an appropriate mask or written with a collimated source of electromagnetic radiation (R. C. Daly and J. L. R. Williams, Polymer News, 11, 164 (1986)). Recently, an electroplating technique has been developed for generating three dimensional metallic surface features by spatially modulating the current density through a variable thickness polymeric film (J. C. Angus, U. Landau, S. H. Liao and M. C. Yang, Journal of the Electrochemical Society, 133, 1152 (1986); Koontz et al., U.S. Pat. No. 4,001,093; and Angus et al., U.S. Pat. No. 4,361,641). In this process the thickness of a gel film applied to the desired substrate is controlled by photochemical crosslinking of the gel film through a mask.

The formation of a photoimaged interpenetrating polymer network (IPN) in polyamic acid has been previously used to control polyamic acid solubility, and thereby create polyimide photoresist patterns (L. Minnema and J. M. van der Zande, Abstracts 30th IUPAC International Symposium on Macromolecules, 224 (1985)). This art does not disclose or suggest the use of a photoimaged polymer network to control permeability.

U.S. Pat. Nos. 3,718,473 and 3,879,204 disclose processes for making gravure printing plate resists, in which processes a photopolymerizable layer is rendered resistant to diffusion of an aqueous etchant when exposed to light. The exposed layer is then placed on a metal sheet which is exposed to an etching solution which produces a continuous tone gravure which is suitable for printing. Unlike the invention which will be described hereinbelow, the systems of the patents involve a two-phase dispersion of monomer, and the surface resist which is produced is not itself a final product, but rather is used to produce a final product, namely, a print. Moreover, there is no disclosure or suggestion in the patents that the extent of swelling, which affects the degree of permeability, can be controlled.

Many factors can affect the diffusive transport of reactants in a swollen matrix, including the size of the reactants and the degree of swelling of the matrix. Many theoretical analyses of these factors have been developed, for example, N. J. Peppas and H. J. Moynihan, Journal of Applied Polymer Science, 30, 2589 (1985). The important pertinent observation is that the permeability of reactants decreases as the degree of matrix swelling is reduced.

It is an object of this invention to provide a process by which zero-valent metal can be deposited and patterned in a sharp two-dimensional fashion within a matrix, for example, a film, such as a polymeric film, for example, an organic polymeric film, by use of diffusion controlled metal deposition processes. Further objects include and provide:

(a) a process by means of which zero-valent metal can be deposited within a matrix;
(b) a process by means of which, if desired, the metal can be deposited as an interlayer within the boundaries of the matrix surfaces;
(c) a process by means of which the position of the interlayer in the matrix can be systematically controlled so as to be any finite distance below the surface of the matrix;
(d) a process by which multiple interlayers can be deposited within a single matrix in a systematically controlled manner;
(e) control over the width of the resultant interlayer by changing the chemical reaction rate between the metal ion and the reductant (R);
(f) a process which, if desired, will yield a metal interlayer having sufficient density, continuity and surface regularity to exhibit electrical conductivity and optical reflectivity which are characteristic of bulk metallic phases or surface coatings; and
(g) a process that does not require an electroactive polymeric matrix, that can be carried out in a single step on a free standing matrix of variable geometry, and that can be used to produce interlayers having sharp boundaries so as to make the matrix more reflective on both sides. These and other objects will become apparent hereinafter.

SUMMARY OF THE INVENTION

In the invention herein, control of the pattern of metallic interlayers (in matrices) produced by counter-current diffusion methods is attained by two dimensional control of the matrix permeability. The permeability preferably is controlled by control of the matrix swelling. Two preferred and illustrated embodiments for controlling the swelling of an organic polymeric matrix are:

(1) selective thermal treatment of the matrix, and
(2) photochemically induced formation of an interpenetrating polymer network. The polymerizable additive can be any that substantially reduces matrix swelling. Polyfunctional monomers are a preferred and exemplified subset.

More specifically, the invention resides in an improved metal interlayer depositon (MID) process in which a metal is deposited at a predetermined location within a preformed shaped matrix having at least two surfaces by counter-current diffusion of metal ions which have been in contact with one surface of the matrix and a reductant which has been in contact with a second surface of the matrix, the improvement comprising carrying out the process with a matrix having at least two contiguous volume elements of different permeability to either the metal ions or the reductant, or both.

DETAILED DESCRIPTION OF THE INVENTION

Figure 1:
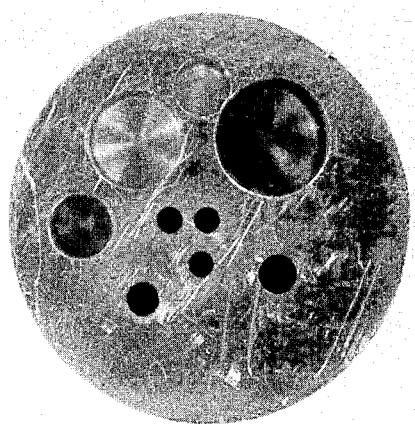
FIG. 1. "Brander" used to place thermal image on a polymeric film.

The present invention combines methods which are known to form metallic interlayers by counter-current diffusion processes with a matrix which has at least two contiguous volume elements of different permeability, such that the diffusion limited process creates a pattern in the matrix corresponding to the preformed pattern of variable permeability. Permeability of the matrix is noted as an important factor in U.S. Pat. No. 4,512,855, supra.

In one embodiment of the invention the permeability of the matrix is controlled by controlling the degree of swelling of the matrix in the solvent used to transport one or both reactants under counter-current diffusion conditions. The present invention has an advantage over other imaging methods for counter-current diffusion processes, for example, the surface barrier methods described in the Background, supra, in that it avoids the inherent loss of resolution due to the lateral diffusion of reactants after passing the surface barrier. Thus, the rate of interlayer formation is dependent on the permeability of the reactants into the matrix. In a matrix with low reactant permeability, the rate of metal interlayer deposition will be slower than in a matrix with high reactant permeability. Hence, if the degree of matrix swelling is controlled in a two dimensional manner, the areas of the matrix with reduced swelling will have less metal deposited by counter-current diffusion methods.

A number of processes are known to affect the swellability of polymeric matrices, for example, organic polymeric matrices, in a given solvent, including the degree of crosslinking and the amount of polymer crystallinity. The present invention provides methods of controlling polymer matrix swellability in a two dimensional fashion and, by analogy, suggests other methods which should work equally well.

The first method for two dimensional control of polymeric matrix swellability is accomplished by selectively heating a permeable form of the polymeric matrix of interest using either a heated branding iron (a "brander") with the desired pattern, or a laser beam. Polymeric matrices which can be used in counter-current diffusion processes must be permeable, a requisite which is not solely dictated by the chemical constitution of the polymer, such as molecular structure and molecular weight, but is also strongly influenced by its physical state, including but not limited to orientation, the presence of plasticizers, extent of crystallinity and degree of crosslinking. Thermal treatment of the polymer can induce increased crystallinity and/or drive out plasticizer. In either case the swellability of the matrix is decreased in the heated areas. After metal interlayer formation by a counter-current diffusion process, the heated areas have less metal present than the nonheated areas. In particularly preferred embodiments, the thermal treatment induces a change in reactant permeability of greater than 100-fold. The resolution of a thermal treatment imaging process is dependent on the time necessary to bring about the change responsible for the decrease in swellability, the temperature sensitivity of the change and the thermal conductivity of the matrix. By means of this invention features as small as 10 micrometers have been produced by heating a polymeric matrix with a laser beam followed by interlayer formation.

A second method for two dimensional control of polymeric matrix swellability depends on the photochemically induced formation of an interpenetrating polymer network (IPN) within the matrix. This IPN acts as a physical restraint to swelling. Thus, for example, a polyfunctional monomer (for example, N,N-methylenebisacrylamide or tetraethylene glycol diacrylate, among many) and photoinitiating additives are added to an ODA/PMDA (4,4'-oxydianiline/pyromellitic dianhydride) polyamic acid solution prior to formation of the matrix. After formation of a film, for example, by spin casting, the polyamic acid matrix is photoimaged using standard photopolymerization methods. The contrast between the photolyzed and non-photolyzed areas of the matrix depends on the photolysis time, that is, the resulting matrix permeability is dependent on the amount of photolysis. The formation of a crosslinked IPN to reduce swelling of a matrix should be applicable to many polymeric matrices, for example, films, cast from solution.

The polyamic acid matrix from above is then chemically converted to polyimide, during which time the unpolymerized polyfunctional monomer diffuses out, leaving an IPN in the photolyzed areas. When 20% (by weight) polyfunctional monomer is added, the area of the matrix with the IPN is about 25% thicker than the unphotolyzed area. Upon addition of solvent to the matrix the uncrosslinked area of the matrix swells considerably more than the crosslinked area. For example, the uncrosslinked area of an ODA/PMDA polyimide film swells 50% in acetonitrile, whereas the crosslinked area swells 3-50%, depending on the degree of crosslinking.

When a matrix with an IPN pattern is developed by the counter-current diffusion method, the photoimaged pattern is reproduced as a metal interlayer image within the matrix. This invention allows the reproduction of gray patterns of varying transmittance. Metallic images with 5 micrometer resolution have been obtained by means of this technique.

Other methods can also affect the swellability of polymeric matrices. For example, if the polymer contains a photocrosslinkable side chain, photolysis will increase the crosslink density and thereby reduce swellability. Exposure of polymers to high energy radiation (x-ray, gamma ray, electron beam) is also known to create crosslinks which will reduce swellability. All of the radiative methods easily lend themselves to application in a patterned fashion and thereby could be used as described to form patterns in counter-current diffusion processes.

The best mode presently contemplated for carrying out the invention is illustrated by Examples 1 and 5. In all the examples which follow temperatures are in degrees Celsius. The examples are intended as demonstrations of the invention and not as limitations of the invention which is described in detail herein.

EXAMPLE 1

Thermal Control of ODA/PMDA Polyimide Permeability Using a Brander as the Heat Source A. Polyamic acid was prepared from 4,4'-oxydianiline (ODA) and pyromellitic dianhydride (PMDA). A 12 wt. % solution of the polyamic acid in dry N,N-dimethylacetamide (DMAc) was filtered through a Millipore ® (10.0 micrometer pore) filter. A clean glass plate (10.3 cm diameter) was spin coated with the polyamic acid solution using a Headway Research Inc. Model EC101D Photoresist Spinner at 860 rpm. The plate was transferred to a hot plate at 80° for a period of 10 minutes until the polymer formed a clear colorless film. The film was converted to the polyimide structure by immersing the plate in a mixture of acetic anhydride and pyridine (equal parts by volume) for a period of two h at room temperature. During conversion to polyimide the film acquired a yellow color, typical of the ODA/PMDA polyimide. The film was rinsed with methanol and air dried. The film thickness as determined by transmission electron microscopy was 12 μm. The film was easily removed intact from the glass plate by slipping a razor blade between the polyimide-glass interface and then lifting the film off by hand. The film was stored on the glass plate until immediately prior to its use.

B. The thermal image was placed in the polyimide film by pressing a heated brander to the surface of the film. The brander consisted of a 2.54 cm aluminum rod with the desired image raised relative to the body of the rod, FIG. 1. The brander shown in FIG. 1 is about 2.63 times the actual size of the brander used. The brander was heated by two resistive heaters embedded in it. The temperature was controlled by an Electronic Control Systems Model 800-262 temperature control unit through a thermocouple mounted in the block. The brander was heated to 300° and pressed to the film for approximately one second. The ODA/PMDA polymeric film rested on a soft support (a thermally stable polymer pad) during the thermal imaging step. After thermal treatment similar to that described above, the film only swelled to 1.2 times its initial thickness when placed in acetonitrile. The ODA/PMDA polymeric film as originally prepared swelled to 1.5 times its initial thickness when placed in acetonitrile.

Figure 2:
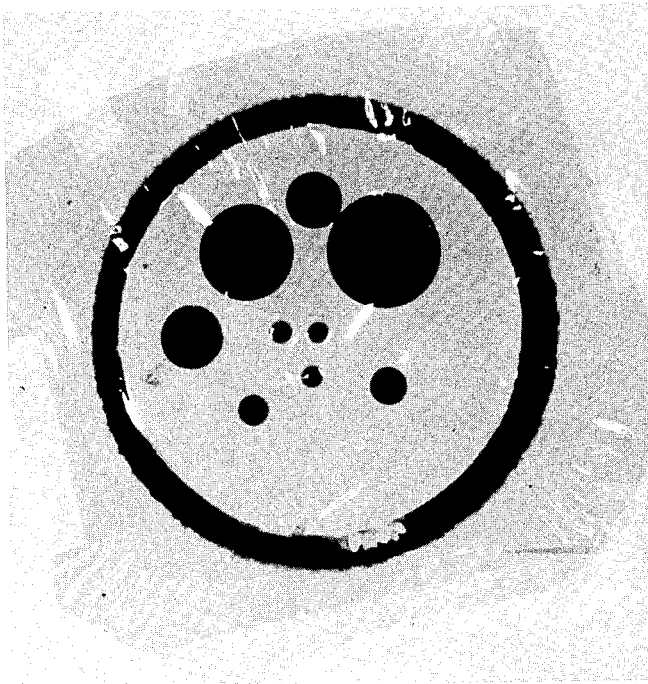
FIG. 2. ODA/PMDA polymeric film with silver interlayer formed after thermal image was placed in film with the "brander" shown in FIG. 1.

C. The silver interlayer deposition process was carried out in a U-tube cell into which the film was clamped such that one half of the U-tube was separated from the other half by the film. The cell consisted of two Pyrex ® half-cells between which the polymeric film was held in place by two Teflon ® washers and two O-rings. The area of film exposed to the solutions was defined by the inner diameter of the Teflon ® washers. During a deposition run, solutions in each half cell were stirred with magnetic stirring bars placed at the bottom of each half cell. The experiment was begun by simultaneously adding 0.01N $AgNO_3$ in acetonitrile to one half of the cell and 0.01N $NaBH_4$ in acetonitrile to the other half of the cell. The solutions were continuously stirred throughout the experiment. The solutions were allowed to counter-current diffuse for 20 minutes. After this exposure, both halves of the cell were quickly emptied and washed with excess acetonitrile. The areas of the film which were not contacted by the brander had a silver interlayer while the areas of the film contacted with the brander did not have a silver interlayer present, FIG. 2. The image shown in FIG. 2 is about 2.63 times the actual size of the image produced.

EXAMPLE 2

Thermal Control of OPA/PMDA Polyimide Permeability Using a Laser as the Heat Source The ODA/PMDA polyimide film as prepared is yellow and a 10 μm thick film will absorb approximately 50% of the 488 nm line of an argon ion laser. This property allows the ODA/PMDA film to be heated by an argon ion laser. The heated areas are rendered less permeable than the nonheated areas, as in Example 1.

Figure 3:
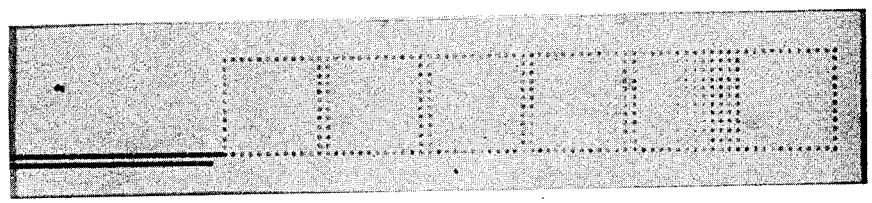
FIG. 3. Optical micrograph of ODA/PMDA polymeric film surface after thermal image was placed in it by laser heating.

An ODA/PMDA film prepared as in Example 1 (prior to removal from the glass plate) was exposed to a 488 nm pulsed laser beam focused to a 0.8 μm spot. A pattern could be drawn in the film by moving the sample (between laser pulses) with a motorized stage synchronized with the laser pulse. In this manner a continuous heated line was drawn by moving the stage less than the width of the laser spot between laser pulses. Similarly, the effect of individual laser pulses was determined by moving the stage much more than the width of the laser spot between laser pulses. In this manner the pattern shown in FIG. 3 was produced. FIG. 3 is an optical micrograph (in reflection) of the surface of an ODA/PMDA film (before removal from the glass plate) after exposure to a series of laser powers and pulse widths. The areas of the film hit by the laser beam can be seen optically because of damage done to the polymer surface by the laser beam. FIG. 3 is divided into 7 sections (based on differing laser exposures) from left to right. Section 1 contains two continuous parallel lines 20 μm apart, each formed by a series of laser pulses (25 mW and 100 microseconds long) by moving the stage 0.2 μm per pulse. Sections 2 to 7 are 10×10 arrays of spots heated with varying laser powers at constant pulse durations. Each 10×10 array is surrounded by a 12×12 border formed with 25 mW pulses of 100 microseconds duration. The ten columns in each array from left to right have been exposed to increasing laser powers of 5 mW (cols. 1 & 2), 10 mW (cols. 3 & 4), 15 mW (cols. 5 & 6), 20 mW (cols. 7 & 8), and 25 mW (cols. 9 & 10). The pulse width for the individual arrays are; section 2=0.5 microsecond, section 3=1.0 microsecond, section 4=5.0 microseconds, section 5=10 microseconds, section 6=50 microseconds, and section 7=10 microseconds.

Figure 4:
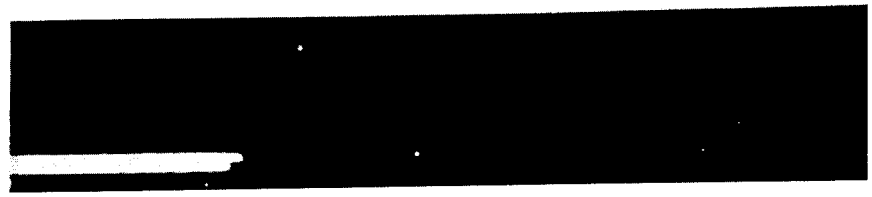
FIG. 4. Optical micrograph of ODA/PMDA polymeric film in transmittance after thermal image was placed in it by laser heating and a silver interlayer was deposited by counter-current diffusion.

After laser exposure, the polyimide film was removed from the glass plate and a silver interlayer formed in it by 15 minute counter-current diffusion of 0.01N $AgNO_3$ and 0.01N $NaBH_4$ in acetonitrile. FIG. 4 is an optical micrograph (taken in transmission) of the polyimide film after formation of the silver interlayer. Section 1 has no silver deposited in the area heated by the laser, parallel lines. Besides the border spots, the only section with a noticeable decrease in interlayer formation is section 6 (50 microseconds pulse duration) in the columns with 20 and 25 mW pulses. This sets a lower limit for the pulse duration/laser power necessary under the above conditions. It is also apparent that the 0.8 μm diameter pulses have created an almost 10 μm diameter spot.

EXAMPLE 3

Thermal Image in Poly(vinylidene fluoride) Film

Poly(vinylidene fluoride) ($PVF_2$) films were prepared by spin casting a 20% solution of $PVF_2$ in dimethylformamide (DMF) onto a glass plate. A brander (as described in Example 1, heated to 160°) was pressed to a 28 μm thick film for about 1 second. After thermal imaging, a metal interlayer was grown in the film by 10 minute counter-current diffusion of 0.02N $AgNO_3$ and 0.02N $NaBH_4$ using acetonitrile as the carrier solvent. The sample had a very high contrast pattern for the first five minutes of counter-current deposition. After ten minutes of counter-current diffusion, an optically dense silver interlayer had deposited in the unheated areas of the film, whereas very little silver had deposited in the heated areas. A similar film branded at 140° showed no contrast after counter-current diffusion under similar conditions. Thus, 140° is not hot enough to render the film impermeable.

EXAMPLE 4

Control of Polymer Film Permeability by the Photochemical Formation of an Interpenetrating Polymer Network Within the Film An interpenetrating polymer network (IPN) of a crosslinkable polyfunctional monomer was photochemically produced in a polyamic acid film prior to chemical conversion of the polyamic acid film to polyimide. After conversion of the film to polyimide, the presence of the IPN reduces the film swelling and thereby reduces the film permeability. When the IPN is formed in a spatially controlled fashion using standard photoresist technology, the metal interlayer formed by countercurrent diffusion is the image of the photoproduced pattern.

To 46 g of an 11.5% solution of polyamic acid in DMAc was added 2.12 g of tetraethylene glycol diacrylate (TTEGDA), 0.50 g of bis(2-o-chlorophenyl-4,5-diphenylimidazolyl) (HABI), 0.05 g of 2-mercaptobenzoxazole (2-MBO) and 25 mg of 2-(4'-diethylamino-2'-methylbenzylidine)-1-indanone (DBI). Similar combinations of chemicals have been disclosed as effective photopolymerizable compositions (commonly assigned U.S. Pat. No. 4,162,162). The constituents were mixed thoroughly and then spin coated (as described in Example 1) onto a 10.3 cm glass plate. The composition was then dried on a hot plate for nine minutes at 80° to provide a film about 25 $\mu$m thick. An optoline photomask, FIG. 5, was placed on top of the film which was irradiated with a 200 W high pressure Hg/Xe arc lamp (Photon Technologies Inc. Model LPS 200X power supply), the light from which was passed through a quartz diffuser and filtered to remove infra-red light. The light hitting the sample was about 25 mW/cm$^2$, most of which was at 365 nm and absorbed by the polyamic acid rather than the sensitizer. The sample was irradiated for five minutes. After irradiation the sample was chemically converted to polyimide as described in Example 1. The film as prepared was now thicker in the areas that had been photolyzed (due to the presence of the IPN) than in the areas that had been protected from the light because the TTEGDA, HABI, 2-MBO and DBI diffuse out of the nonphotolyzed areas during the chemical conversion process. The film was 12 $\mu$m thick in the completely photolyzed areas and 9.4 $\mu$m thick in the nonphotolyzed areas.

After chemical conversion to polyimide, the film was removed from the glass plate and a silver interlayer formed in it by 10 minute counter-current diffusion of 0.02N AgNO$_3$ and 0.02N NaBH$_4$ in acetonitrile. FIG. 6 is an optical micrograph (taken in transmission) of the polyimide film after formation of the silver interlayer. The process reproduced the pattern in FIG. 5, including the gray scale, indicating that the observed contrast is dependent on the extent of photolysis.

Figure 5:
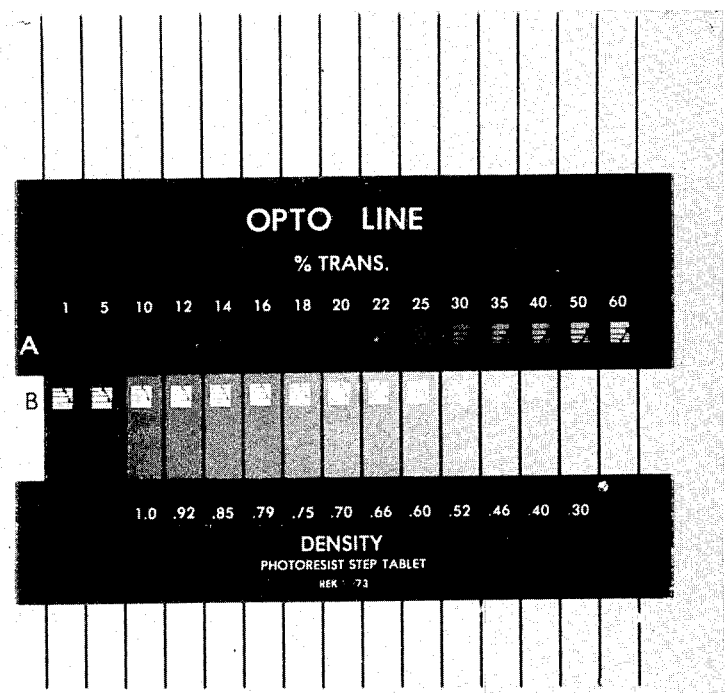
FIG. 5. Photomask placed on top of polymeric film during photochemical formation of the interpenetrating polymer network.
Figure 6:
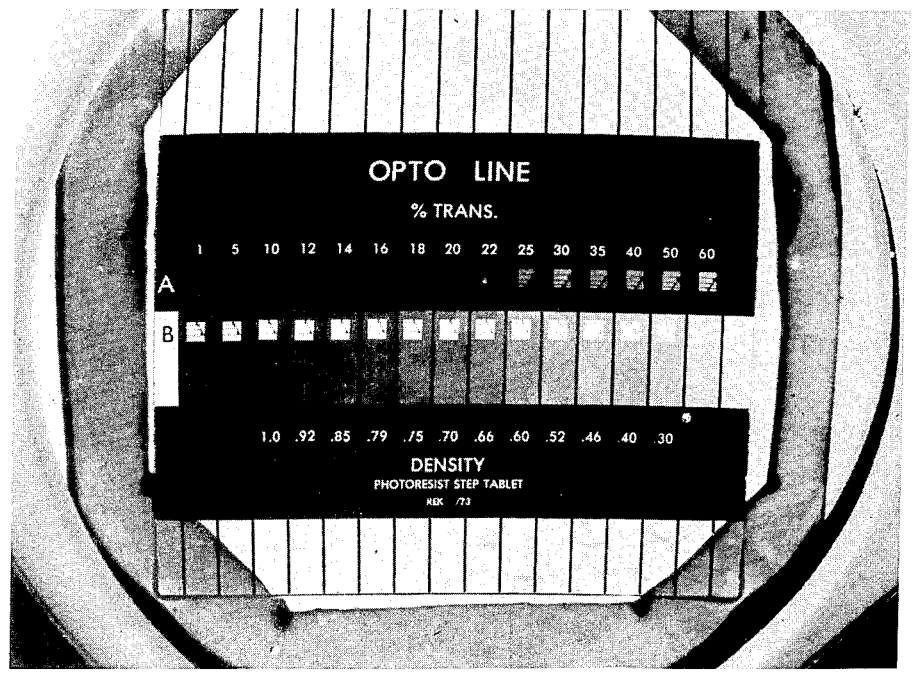
FIG. 6. ODA/PMDA polymeric film with silver interlayer formed after photochemical formation of a interpenetrating polymer network.

In both FIGS. 5 and 6 the dimensions shown are about 2.17 times the actual dimensions of the photomasks and films described in this example.

EXAMPLE 5

Formation of a High Contrast Pattern by Control of Polymer Film Permeability Using Photochemical Formation of an Interpenetrating Polymer Network Within the Film Similar to Example 4, an interpenetrating polymer network (IPN) of a crosslinkable multifunctional monomer was photochemically produced in a polyamic acid film prior to chemical conversion of the polyamic film to polyimide.

To 46 g of an 11.5% solution of polyamic acid in DMAc was added 0.5 g of bis(2-o-chlorophenyl-4,5-diphenylimidazolyl) (HABI), 0.05 g of 2-mercaptobenzoxazole (2-MBO) and 0.10 g of 2-(4'-diethylamino-2'-methylbenzylidene)-1-indanone (DBI). To 11.5 g of this solution was added 0.265 g of tetraethylene glycol diacrylate (TTEGDA). The constituents were mixed thoroughly and then spin coated (as described in Example 1) onto a 106 cm$^2$ SnO$_2$ coated glass plate. The composition was then placed in an oven for 20 minutes at 85° to provide a film about 25 $\mu$m thick. A photomask was placed on top of the film prior to irradiation with a 200 W high pressure Hg/Xe arc lamp (Photon Technologies Inc. Model LPS 200X power supply), the light from which was passed through a quartz diffuser and filtered to remove infrared light. The light hitting the sample was about 10 mW/cm$^2$. The sample was irradiated for ten minutes. After irradiation the sample was chemically converted to polyimide by soaking in pyridine:acetic anhydride:acetonitrile (1:1:5) for one hour. The film as prepared was now thicker in the areas that had been photolyzed (due to the presence of the IPN) than in the areas that had been protected from the light, because the TTEGDA, HABI, 2-MBO and DBI diffuse out of the non-photolyzed areas during the chemical conversion process. The film was about 14.8 $\mu$m thick in the non-photolyzed areas. Exposure to acetonitrile swelled the nonphotolyzed area 43% and the photolyzed area 24%.

After chemical conversion to polyimide, silver was electrochemically deposited in the film in accordance with procedures disclosed in application Ser. No. 901,770 (supra). The pattern had 100 $\mu$m wide silver lines deposited as interlayers in the nonphotolyzed areas and no observable silver deposited in the photolyzed areas. The silver lines were both conductive (resistance=20 to 40 ohms/cm after sintering at 330° for 10 minutes) and reflective.

Although the above disclosure has been directed principally to the use of matrices which are organic polymeric in nature, it is envisioned that the principles of the invention are broadly applicable to any matrix, organic or inorganic, polymeric or nonpolymeric, that is amenable to the counter-current diffusion metal interlayer deposition process and whose permeability to metal ions and/or reductant can be altered.

I claim:

1. In an improved metal interlayer deposition (MID) process in which a metal is deposited at a predetermined location within a preformed shaped matrix having at least two surfaces by counter-current diffusion of metal ions which have been in contact with one surface of the matrix and a reductant which has been in contact with a second surface of the matrix, the improvement comprising carrying out the process with a matrix having at least two contiguous volume elements of different permeability to either the metal ions or the reductant, or both.

2. Process of claim 1 wherein the matrix is a polymeric matrix.

3. Process of claim 2 wherein the matrix is an organic polymeric matrix.

4. Process of claim 3 wherein the matrix is comprised of a polyimide.

5. Process of claim 3 wherein the metal of the interlayer is silver.

6. Process of claim 3 wherein the metal of the interlayer is gold.

7. Process of claim 1 wherein the matrix is in the form of a film.

8. In an improved metal interlayer deposition (MID) process in which a metal is deposited at a predetermined location within a preformed shaped organic polymeric matrix having at least two surfaces by counter-current diffusion of metal ions which have been in contact with one surface of the matrix and a reductant which has been in contact with a second surface of the matrix, the improvement comprising:
 (a) treating a selected portion of the matrix for at least such time that the permeability to the metal ions and/or the reductant is different in the treated and untreated portions of the matrix; and
 (b) carrying out the counter-current diffusion process to produce a metal interlayer within the matrix, the metal interlayer comprised of less metal in the portion of the matrix that was treated in step (a) than in the portion of the matrix that was untreated in step (a).

9. In an improved metal interlayer deposition (MID) process in which a metal is deposited at a predetermined location within a preformed shaped organic polymeric matrix having at least two surfaces by counter-current diffusion of metal ions which have been in contact with one surface of the matrix and a reductant which has been in contact with a second surface of the matrix, the improvement comprising:
 (a) heating a selected portion of the matrix for at least such time that the permeability to the metal ions and/or the reductant is different in the heated and unheated portions of the matrix; and
 (b) carrying out the counter-current diffusion process to produce a metal interlayer within the matrix, the metal interlayer comprised of less metal in the portion of the matrix that was heated in step (a) than in the portion of the matrix that was unheated in step (a).

10. Process of claim 9 wherein the difference in permeability between the heated and unheated portions of the matrix is greater than 100-fold.

11. Process of claim 9 wherein the heating of the selected portion of the matrix is effected by means of a laser.

12. In an improved metal interlayer deposition (MID) process in which a metal is deposited at a predetermined location within a preformed shaped organic polymeric matrix having at least two surfaces by counter-current diffusion of metal ions which have been in contact with one surface of the matrix and a reductant which has been in contact with a second surface of the matrix, the improvement comprising:
 (a) introducing into the matrix either during or after matrix formation a photopolymerizable composition;
 (b) photopolymerizing a selected portion of the photopolymerizable composition in the matrix to provide a patterned interpenetrating polymer network within the matrix;
 (c) introducing a matrix-swelling solvent into the matrix to produce a swollen matrix, the swelling being less in the region comprised of the patterned interpenetrating polymer network; and
 (d) carrying out the counter-current diffusion process to produce a metal interlayer within the matrix, the metal interlayer comprised of less metal in the portion of the matrix that is comprised of the patterned interpenetrating polymer network.

13. Matrix having deposited within it a metal interlayer and produced by the process of claim 1.

14. Matrix of claim 13 comprised of a film.

15. Matrix of claim 13 comprised of a polymer.

16. Matrix of claim 15 comprised of an organic polymer.

17. Matrix of claim 16 comprised of a polyimide.

18. Matrix of claim 16 wherein the metal of the interlayer is silver.

19. Matrix of claim 16 wherein the metal of the interlayer is gold.

* * * * *